(12) United States Patent
Song et al.

(10) Patent No.: US 12,548,737 B2
(45) Date of Patent: Feb. 10, 2026

(54) POLYMERIC COATING FOR SEMICONDUCTOR PROCESSING CHAMBER COMPONENTS

(71) Applicant: Lam Research Corporation, Fremont, CA (US)

(72) Inventors: Yuanping Song, Newark, CA (US); Johnny Pham, San Jose, CA (US); Yiwei Song, Morgan Hill, CA (US); Lin Xu, Fremont, CA (US); Christopher Kimball, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 139 days.

(21) Appl. No.: 18/546,174

(22) PCT Filed: Feb. 25, 2022

(86) PCT No.: PCT/US2022/018001
§ 371 (c)(1),
(2) Date: Aug. 11, 2023

(87) PCT Pub. No.: WO2022/192012
PCT Pub. Date: Sep. 15, 2022

(65) Prior Publication Data
US 2024/0120180 A1 Apr. 11, 2024

Related U.S. Application Data

(60) Provisional application No. 63/158,115, filed on Mar. 8, 2021.

(51) Int. Cl.
*H01J 37/32* (2006.01)
*B05D 1/02* (2006.01)

(52) U.S. Cl.
CPC ......... *H01J 37/32477* (2013.01); *B05D 1/02* (2013.01); *H01J 37/32715* (2013.01);
(Continued)

(58) Field of Classification Search
None
See application file for complete search history.

(56) References Cited

U.S. PATENT DOCUMENTS

| 4,417,954 A | 11/1983 | Birkle et al. |
| 6,699,798 B2 * | 3/2004 | Rockford ............ H01L 21/3127 |
| | | 257/E21.264 |

(Continued)

FOREIGN PATENT DOCUMENTS

| JP | 09-199581 | 7/1997 |
| JP | 10-101432 | 4/1998 |

(Continued)

OTHER PUBLICATIONS

International Search Report and Written Opinion from International Application No. PCT/US2022/018001 dated Jun. 10, 2022.

(Continued)

*Primary Examiner* — Kenneth B Wells
(74) *Attorney, Agent, or Firm* — Beyer Law Group

(57) ABSTRACT

A component in a semiconductor processing chamber is provided. An electrically conductive semiconductor or metal body has a CTE of less than $10.0 \times 10^{-6}$/K. An intermediate layer is disposed over at least one surface of the body, the intermediate layer comprising a fluoropolymer. A perfluoroalkoxy alkane (PFA) layer is disposed over the intermediate layer to form the component.

21 Claims, 5 Drawing Sheets

(52) U.S. Cl.
CPC .... *H01J 37/32807* (2013.01); *B05D 2203/30* (2013.01); *B05D 2506/10* (2013.01); *H01J 2237/0213* (2013.01)

(56) References Cited

U.S. PATENT DOCUMENTS

| | | |
|---|---|---|
| 7,234,222 B1 | 6/2007 | Hao et al. |
| 7,992,518 B2 | 8/2011 | Wu et al. |
| 2003/0150558 A1 | 8/2003 | Lynn |
| 2004/0002221 A1 | 1/2004 | O'Donnell et al. |
| 2006/0102080 A1 | 5/2006 | Liu et al. |
| 2014/0034242 A1* | 2/2014 | Sant .................. H01J 37/32605 29/458 |
| 2015/0179412 A1* | 6/2015 | Chhatre ............ H01J 37/32642 156/345.52 |
| 2016/0181142 A1* | 6/2016 | Raj .................. H01L 21/67098 264/129 |
| 2019/0169444 A1 | 6/2019 | Gangakhedkar |
| 2019/0228953 A1 | 7/2019 | Tachikawa et al. |
| 2021/0082737 A1* | 3/2021 | Kim .................. H01L 21/68757 |

FOREIGN PATENT DOCUMENTS

| | | |
|---|---|---|
| JP | 2008-211183 | 9/2008 |
| JP | 2014-165459 | 9/2014 |
| JP | 2018-056333 | 4/2018 |
| WO | 03-068504 | 8/2003 |
| WO | 2013/008369 | 1/2013 |
| WO | 2021/026110 | 2/2021 |
| WO | 2022/046643 | 3/2022 |

OTHER PUBLICATIONS

Gustavo R. Vallejo and David D. Dayton. "Ultra High Purity Electroplated Aluminum Coatings for Critical Components in Dry Etch and Process Chamber Environments." AlumiPlate, Inc., Jun. 2015.

Korean Office Action from Korean Application No. 10-2022-7044024 dated Sep. 15, 2025 with Machine Translation.

Japanese Notice of Refusal from Japanese Application No. 2023-553185 dated Nov. 21, 2025 with Machine Translation.

* cited by examiner

POLYMERIC COATING FOR SEMICONDUCTOR PROCESSING CHAMBER COMPONENTS

CROSS-REFERENCE TO RELATED APPLICATION

This application claims the benefit of priority of U.S. Application No. 63/158,115, filed Mar. 8, 2021, which is incorporated herein by reference for all purposes.

BACKGROUND

The present disclosure generally relates to the manufacturing of semiconductor devices. More specifically, the disclosure relates to chamber components used in manufacturing semiconductor devices.

During semiconductor wafer processing, plasma processing chambers are used to process semiconductor devices. Plasma processing chambers are subjected to plasmas of halogen and/or oxygen, which may degrade components in the plasma processing chambers.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

To achieve the foregoing and in accordance with the purpose of the present disclosure, a component in a semiconductor processing chamber is provided. An electrically conductive semiconductor or metal body has a CTE of less than $10.0 \times 10^{-6}$/K. An intermediate layer is disposed over at least one surface of the body, the intermediate layer comprising a fluoropolymer. A perfluoroalkoxy alkane (PFA) layer is disposed over the intermediate layer to form the component.

In another manifestation, an edge ring for use in a plasma processing chamber is provided. An elemental silicon edge ring body is provided. A fluoropolymer is on at least one surface of the elemental silicon edge ring body. A perfluoroalkoxy alkane (PFA) coating is on the fluorinated ethylene propylene) or polyethersulfane coating.

In another manifestation, a method for forming a component for use in a semiconductor processing chamber is provided. An electrically conductive semiconductor or metal body is provided, where the body has a CTE of less than $10.0 \times 10^{-6}$/K. An intermediate layer is formed over at least one surface of the body, the intermediate layer comprising a fluoropolymer. A perfluoroalkoxy alkane (PFA) layer is formed over the intermediate layer to form the component.

These and other features of the present disclosure will be described in more detail below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which:

FIG. 2A is a top view of a component substrate in the form of an edge ring. FIG. 2B is a cross-sectional view of the component substrate of FIG. 2A. FIG. 2C is a cross-sectional detail view of the surface of the substrate of FIG. 2A. FIG. 2D is a cross-sectional detail view of an intermediate fluoropolymer layer coated to the substrate of FIG. 2A. FIG. 2E is a cross-sectional detail view of the structure of FIG. 2D after a perfluoroalkoxy alkane (PFA) layer has been applied to the fluoropolymer intermediate layer to form a component for a plasma processing chamber.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Various embodiments described herein provide semiconductor processing chamber components that are resistant to damage by arcing and/or erosion by processes such as plasma etching and thus inhibit or minimize consumption of the component that may occur from plasma and etching processes inherent in semiconductor processing systems such as a plasma processing chamber.

Figure 1:
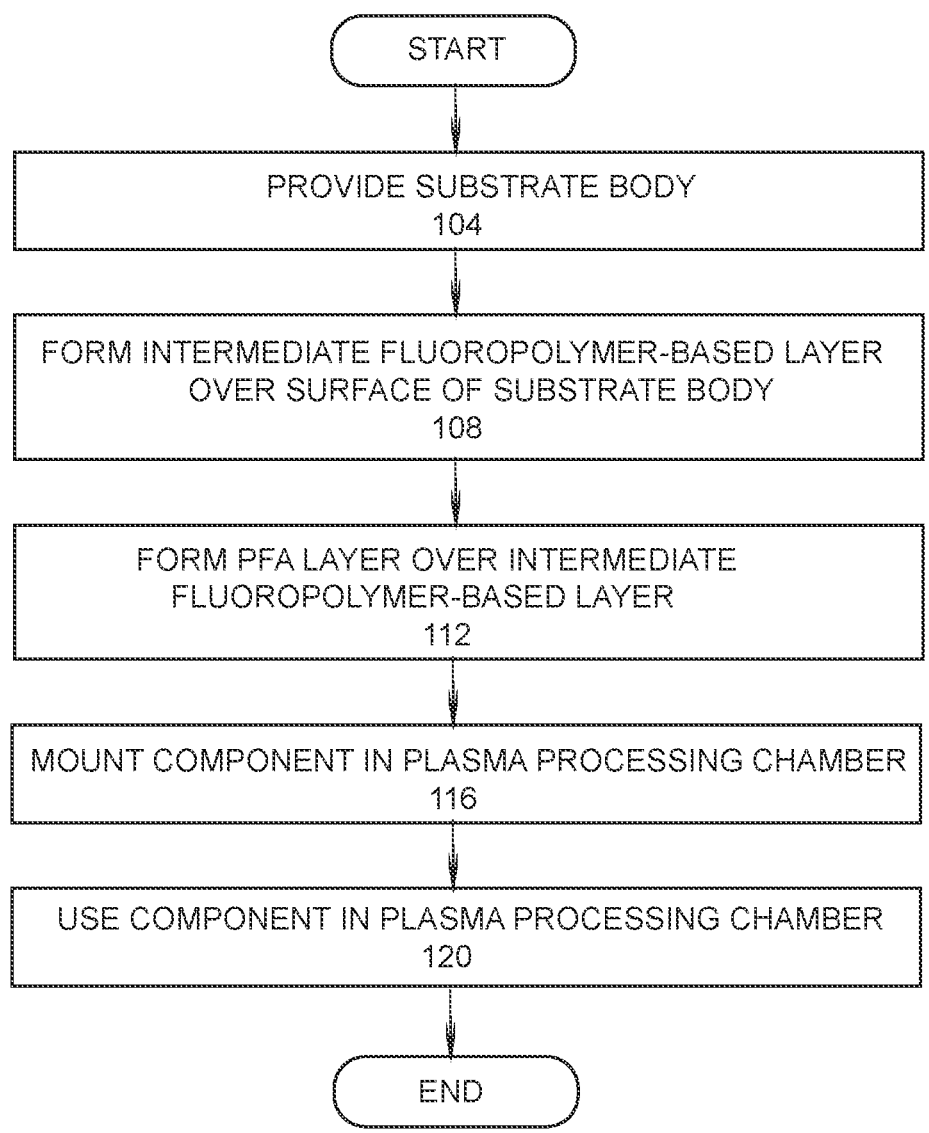
FIG. 1 is a high level flow chart of an embodiment.

To facilitate understanding, FIG. 1 is a high level flow chart of a process of a first embodiment of fabricating and using a component for a semiconductor processing chamber such as a plasma processing chamber. A component body is provided (step 104). The component body comprises an electrically-conductive semiconductor or metallic material having a low coefficient of thermal expansion (CTE) (e.g., less than $10.0 \times 10^{-6}$/K~$5.0 \times 10^{-6}$/K). As will be explained in further detail below, the electrical conductivity and low-CTE of the component body are particularly beneficial attributes for use in components of semiconductor processing chambers such as plasma processing chambers.

Figure 2A:
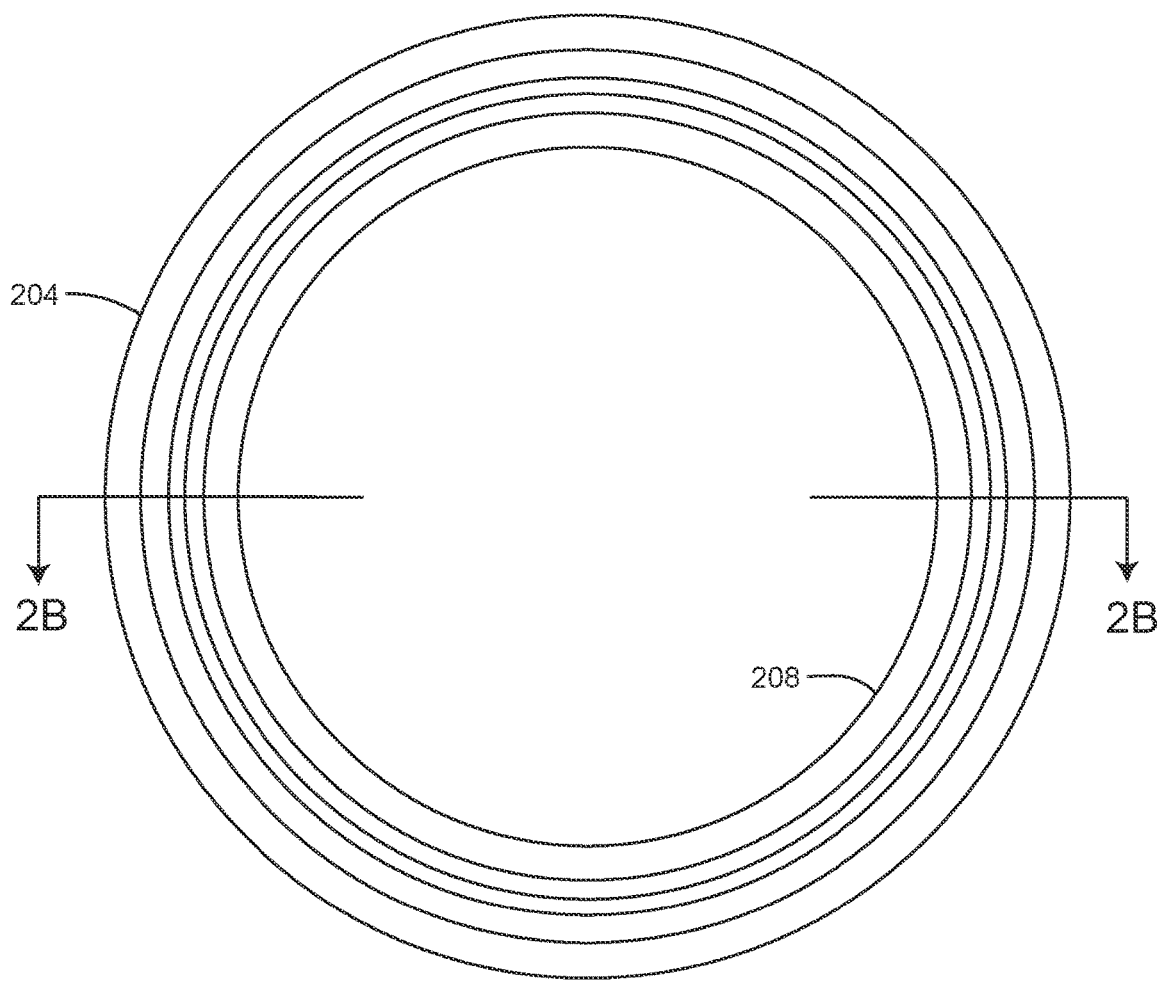
FIG. 2A-FIG. 2E show an embodiment of a method for fabricating an edge ring component for use in a plasma processing chamber.
Figure 2B:
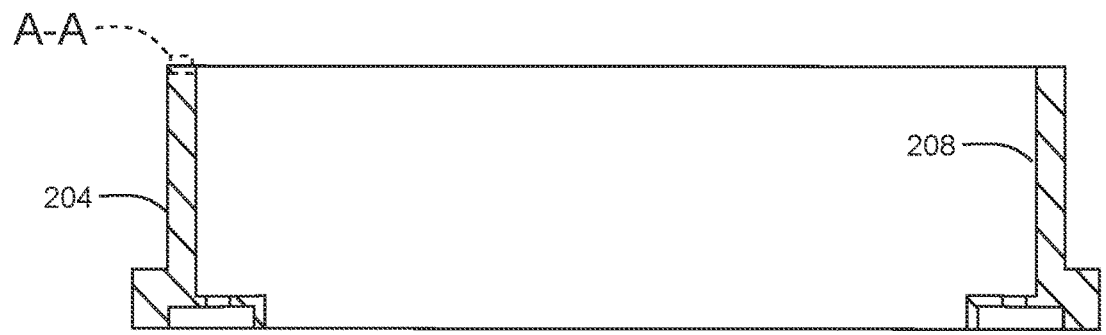
Figure 2C:
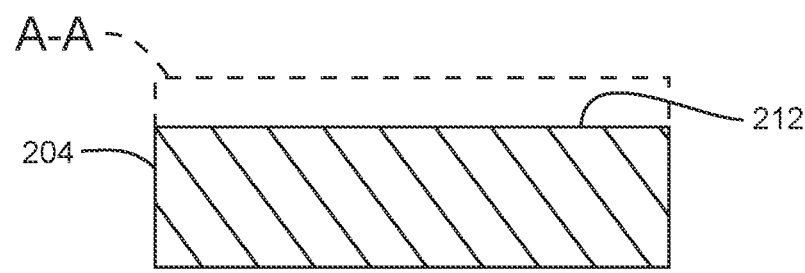

Referring to FIG. 2A through FIG. 2C, the provided substrate body 204 may be formed in the shape of a component for use in a plasma processing chamber, such as an edge ring having an inner radial surface or central bore 208 at least partially surrounding an electrostatic chuck (ESC). FIG. 2A is a top view of the substrate body, and FIG. 2B is cross-sectional view of the substrate body. FIG. 2C shows a close-up view of a section A-A of the substrate body surface 212. It is appreciated that the images shown in FIG. 2A through FIG. 4 are for illustrative purposes only and may vary with regard to scale, form, and features. The substrate body 204 may be formed via a number of various fabrication processes, e.g., machining, molding, sintering, polishing, chemical etching, etc.

According to an embodiment, the substrate body 204 comprises an electrically-conductive material having a low coefficient of thermal expansion (CTE) (e.g., less than 10.0×10$^{-6}$/K, and in a further embodiment less than 5.0×10$^{-6}$/K). In a further embodiment, the substrate body 204 comprises an electrically conductive semiconductor, and in particular an electrically conductive multi-crystalline doped-silicon or silicon carbide semiconductor material. In another embodiment, the substrate body 204 comprises elemental silicon. In alternative embodiments, the substrate body may comprise other electrically-conductive semiconductors (e.g., germanium) or low-CTE metals (e.g., titanium, etc.). In various embodiments, the semiconductor may be poly-crystalline Multi-crystalline silicon has grains that are on average larger than grains of poly-crystalline silicon. Multi-crystalline silicon has an average grain size that is over 1 mm. The low coefficient of thermal expansion generally provides less stress, abrasion, and a better fit between components. In particular, during chamber processing, the edge ring and other adjacent parts (ESC baseplate in particular) will be at different temperatures. Due to the heating caused by plasma, the edge ring is generally much hotter (in the range of 150° C. to 250° C.) than the ESC baseplate, of which the temperature is actively controlled (in the range of −40° C. to 50° C.). When we choose an edge ring material with a small thermal expansion coefficient, we effectively reduce the variation of the gap size between the edge ring and adjacent parts (ESC), so that a more consistent capacitance between the two conductors can be achieved. As a result, electrically we will have a more consistent performance.

In one embodiment, the component body is formed by casting a conductive semiconductor to form a specified component shape, e.g., by pouring or injecting a molten semiconductor into a mold, wherein the molten semiconductor cools in a hardened form in the mold to form a multi-crystalline structure having a large grain size. In other embodiment, the semiconductor is solidified into a cylindrical shape, then machined to the final geometry through abrasive grinding or other machining technique.

Figure 2D:
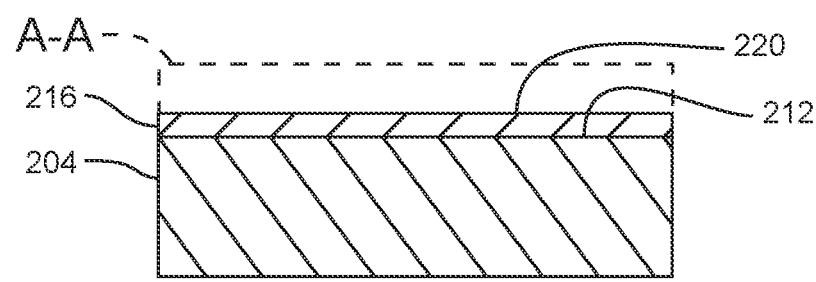

Referring to FIG. 1 and FIG. 2D, after the substrate body 204 is provided, an intermediate fluoropolymer layer 216 (FIG. 2D) is formed over one or more surfaces 212 of the substrate body 204 (step 108). Intermediate fluoropolymer layer 216 aids in attachment of subsequent layers (e.g., PFA layer 224 in FIG. 2D) to the substrate body 204. In one embodiment, the intermediate fluoropolymer layer 216 comprises a fluoropolymer such as fluorinated ethylene propylene (FEP) having a high curing temperature (e.g., 350° C. to 400° C.) and composition that aids in bonding the subsequent PFA layer 224. In another embodiment, the intermediate fluoropolymer layer 216 layer comprises a resin, e.g., polyethersulfane (PES), to aid in bonding to the substrate surface 212. Additionally, the intermediate fluoropolymer layer 216 has little to no pigmentation (i.e., is clear) so as to minimize contamination in the processing chamber. To aid in deposition (e.g., liquid spray deposition techniques), the intermediate fluoropolymer layer 216 comprises a solvent-borne or water-borne composition. In one embodiment, intermediate fluoropolymer layer 216 is composed of Xylan® 8840 dry film lubricant, manufactured by PPG Industries Ohio, Inc. of Cleveland, Ohio. However, it is appreciated that any resin-bonded or resin-based, FEP-based coating may be used, particularly one that is solvent or water-borne.

According to some embodiments, the intermediate fluoropolymer layer 216 is deposited using a spray deposition method that provides a substantially uniform layer to act as a primer for coating of a subsequent layer with proper adhesion to the underlying substrate body 204. To aid in spray deposition, the intermediate fluoropolymer layer 216 is water or solvent-borne. In alternative embodiments, deposition methods such as chemical vapor deposition (CVD), Plasma Enhanced Chemical Vapor Deposition (PECVD), atomic layer deposition (ALD), electrodeposition (also referred to as electrophoretic coating, e.g., Elecoat Nicelon™ coating by Shimizu Co. Ltd. (shimizu-corp.co.jp)) or the like deposition method may be employed. In one embodiment, prior to application of any coating layers, the substrate body 204 is pre-processed to remove or substantially remove any oxides (e.g., silicon oxide) and superficial damage to the substrate surface 212 or loosely attached microstructures on the substrate surface 212 that may have occurred during the fabrication process. For example, when priming a silicon substrate, a deionized (DI) water rinse may be performed on the substrate body 204, followed by a mixed acid etch to remove any superficial deficiencies, and also increase the surface roughness e.g., to 20 microns or more.

The thickness of intermediate fluoropolymer layer 216 may be varied based upon one or more factors, including type of component, location of the component, geometry of the component, substrate material properties, cost, etc. According to one embodiment, the thickness of intermediate fluoropolymer layer 216 is between about 1 micrometer (μm) to 30 μm.

Figure 2E:
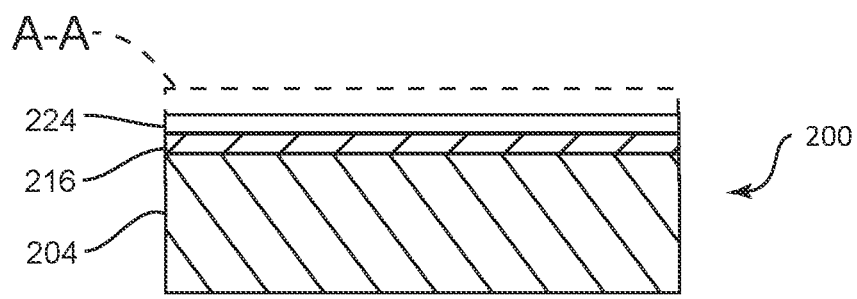

Referring to FIG. 1 and FIG. 2E, after the intermediate fluoropolymer layer 216 is formed, a final coating or layer is applied to the surface 220 of the intermediate fluoropolymer layer 216, the final coating layer also being a fluoropolymer with superior resistance to acids at high temperatures (e.g., perfluoroalkoxy alkane (PFA)), hereinafter referred to as PFA layer 224. Other fluoropolymers may also be considered. For example, Polytetrafluoroethylene (PTFE) may be used, but is generally more porous. FIG. 2E shows a cross-sectional view of an embodiment of a portion of the substrate body 204 after application of the PFA layer 224. As shown in FIG. 2E, PFA layer 224 is additive above the original surface 220 of the intermediate fluoropolymer layer 216, thus increasing the overall thickness of the part. In some embodiments, the PFA layer 224 is at least 20 μm thick and can be as thick as 150 μm or more. Because PFA generally has poor adhesion characteristics to metals and semiconductors such as silicon, the intermediate fluoropolymer layer 216 acts as a primer to the substrate body 204. Because PFA bonds well to the intermediate fluoropolymer layer 216, which does have good overall adhesion with the semiconductor substrate body 204, the resulting PFA layer 224 coating is securely attached to the substrate body 204 to minimize delamination or separation therefrom. According to some embodiments, the PFA layer 224 is applied to the intermediate fluoropolymer layer 216 using an electrostatic power spray deposition method that provides a substantially uniform layer over the surface of the substrate body 204.

The resultant PFA-coated substrate body that is fabricated according to steps 104 through 112 of the process of FIG. 1, as detailed above has minimal contaminants and increased corrosion resistance to chemicals and corrosive processes inherent in semiconductor processing chambers.

After the component 200 is properly processed via steps 104 through 112 of FIG. 1, it is then installed in a semiconductor processing chamber, such as a plasma processing chamber (step 116, FIG. 1). The fabrication process illustrated in FIG. 1 is particularly useful for fabricating plasma processing chamber components using substrate materials that would normally be consumed very quickly by the oxygen/halogen reactive species common in plasma processing chambers.

In the following embodiments, the component 200 formed from the processes illustrated in FIG. 1, and FIG. 2A through FIG. 2E is directed to a particular application as an edge ring or similar component within an electrostatic chuck (ESC) assembly or system (e.g., ESC assembly 300 in FIG. 3) for use in a plasma processing chamber (e.g., plasma processing chamber 404 shown in FIG. 4). However, it is appreciated that the component 200 formed from the processes illustrated in FIG. 1, and FIG. 2A through FIG. 2E may be implemented as any number of components within the ESC assembly 300 or plasma processing chamber 404, such as pinnacles and electrostatic chucks (ESC's), in addition to high flow liners, gas distribution plates, etc., among other parts, to the extent the properties of high corrosion resistance, good electrical conductivity, and low coefficient of thermal expansion are desired.

Figure 3:
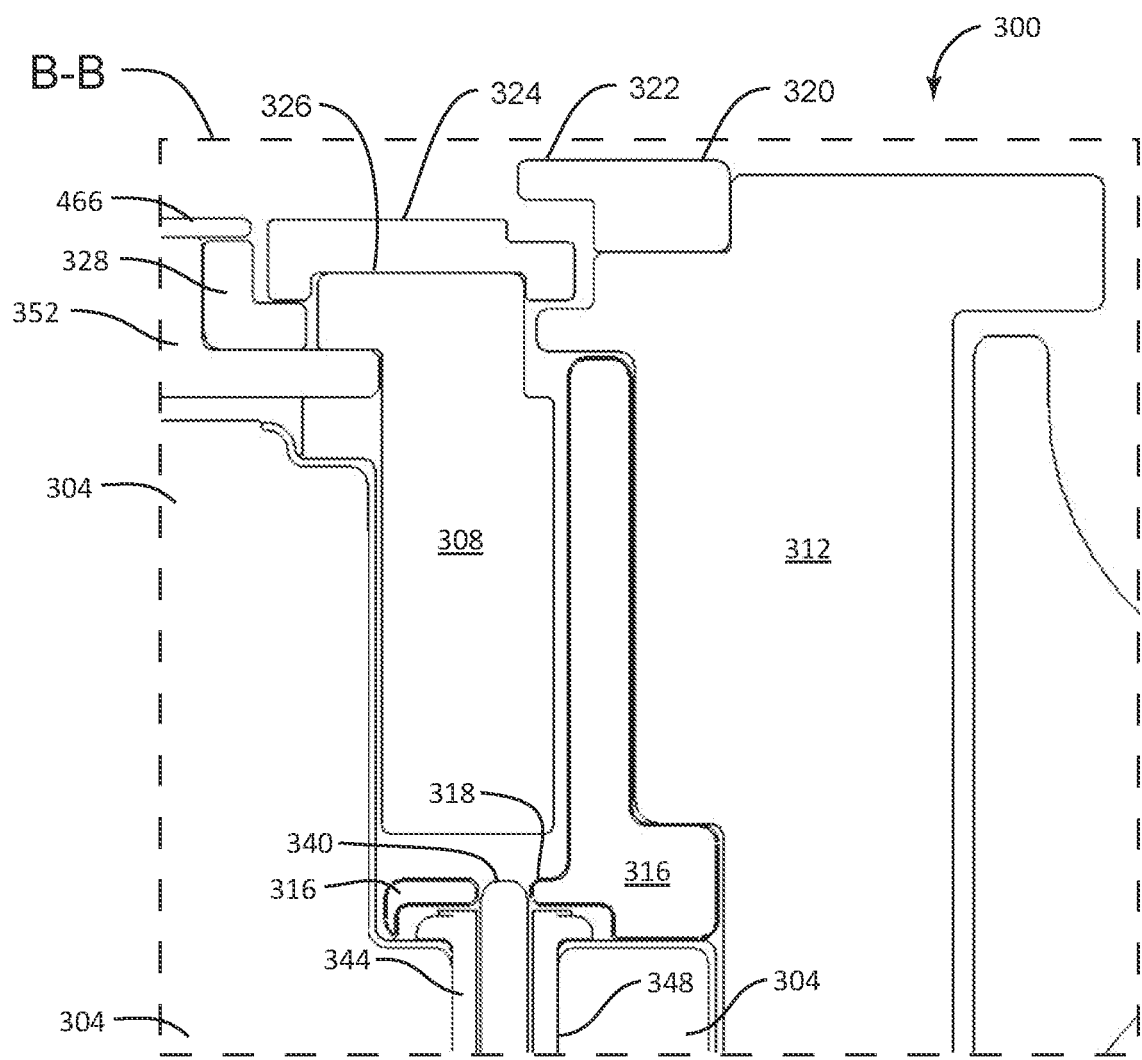
FIG. 3 is a section view of a portion of a plasma processing chamber.

FIG. 3 illustrates a section view of a portion (defined by section B-B shown in FIG. 4) of an ESC assembly 300 having a movable edge ring configuration for use in a plasma processing system. ESC assembly 300 includes a top edge ring 324 configured to surround an electrostatic chuck (ESC) 304. ESC 304 may also be referred to as a substrate support that acts as a support for process wafer 466 during processing. The top edge ring 324 has an annular lower recess 326 that is supported by a movable edge ring 308. The movable edge ring 308 is disposed to vertically articulate within a cavity defined by an inner radial side comprising the ESC 304, heating plate 352, and middle inner edge ring 328, and an outer radial side comprising a static edge ring 316, outer edge ring 312 and cover edge ring 320. The cover edge ring 320 has a radial inner protrusion 322 partially covering the top edge ring 324.

Because the top edge ring 324 is exposed to erosive plasma and etchants in the processing of process wafer 466, it invariably becomes worn and thus its thickness is reduced in height with increasing exposure. Accordingly, the movable edge ring 308 is used to raise the top edge ring 324 to restore the height relationship between a top surface of the top edge ring 324 and the process wafer/substrate 466. To affect such height adjustment, one or more lift pins 340 are vertically actuated (through an aperture 348 in the ESC 304 and aperture 318 in static edge ring 316) to push up the movable edge ring 308, which in turn adjusts the vertical orientation of the top edge ring 324. A sleeve 344 is disposed about the circumference of the lift pin 340 to seal off the aperture 348 of the ESC 304.

According to an embodiment, component 200 is fabricated in accordance with the processes of FIG. 1, and FIG. 2A through FIG. 2E to form a static edge ring 316 for mounting in ESC assembly 300. Due to its location in the chamber and proximity/exposure to plasma in the processing of process wafer 466 (i.e., bearing one or more "plasma-facing surfaces"), the static edge ring 316 benefits greatly from the anti-corrosion properties of the intermediate fluoropolymer/PFA coating 216/224 of the component 200. In an example, plasma may pass between the top edge ring 324 and the outer edge ring 312 and cover edge ring 320 to an outer surface of the movable edge ring 308 and an inner surface of the static edge ring 316 (e.g., inner radial surface or central bore 208 in FIG. 2B). The amount of plasma that is passed is dependent on the position of the top edge ring 324. In addition, in the position shown in FIG. 3, the top edge ring 324 may prevent plasma from passing between the top edge ring 324 and the middle inner edge ring 328 and/or outer edge ring 312 to the inner or outer surfaces of the movable edge ring 308. When the movable edge ring 308 raises the top edge ring 324, a gap is made between the top edge ring 324 and the middle inner edge ring 328 and/or outer edge ring 312 allowing plasma to reach the surfaces of the movable edge ring 308 and static edge ring 316.

In one embodiment, the entire outer surface of the static edge ring 316 may be processed to include the intermediate fluoropolymer/PFA coating 216/224 as provided in component 200. However, it is appreciated that only a portion of the external surface of the component needs to be processed. For example, the outer or external radial surface of static edge ring 316 may be excluded from the PFA layer 224 (e.g., with a mask or like process), such that only a plasma-facing surface (e.g., inner radial surface 208—see FIG. 2B) comprises the intermediate fluoropolymer/PFA coating 216/224. Such a partial coating process may require masking portions that are not coated. A plasma-facing surface is a surface that is either exposed to a plasma during plasma processing or is exposed to a reactive halogen species at high temperature and low pressure. The reactive halogen species may be formed from a remote plasma or thermally reactive fluorine. In some embodiments, points on the movable edge ring 308 are not coated since those points may be used to connect with electrodes during the electroplating process.

Furthermore, the movable edge ring 308, along with static edge ring 316, provides an RF conduction (alternating current) path to the ESC 304 to achieve more uniform plasma during chamber process to improve near-edge wafer processing uniformity, thus benefitting from the electrically conductive nature of the component 200 substrate body 204. Accordingly, the movable edge ring 308 and top edge ring 324, among other components in the ESC assembly 300 and plasma processing chamber system 400, may also be formed with the intermediate fluoropolymer/PFA coating 216/224 of component 200 using the processes illustrated in FIG. 1, and FIG. 2A through FIG. 2E.

Referring back to the process disclosed in FIG. 1, the component 200 is used in a plasma processing chamber to facilitate semiconductor fabrication on the process wafer 466 (step 120). The plasma processing may be one or more processes of etching, depositing, passivating, or another plasma process. The plasma processing may also be performed in combination with nonplasma processing.

Figure 4:
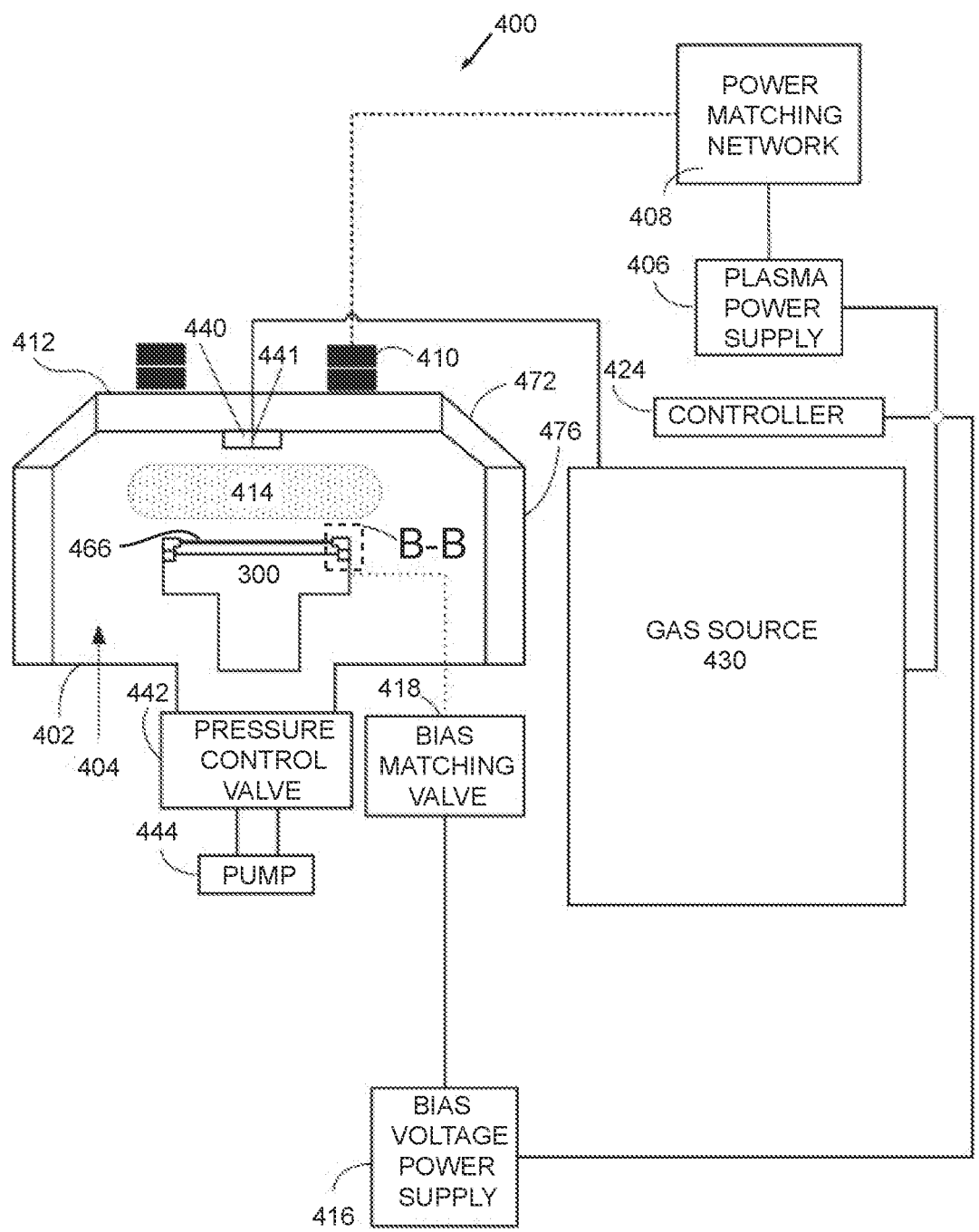
FIG. 4 is a schematic view of a plasma processing chamber that may be used in an embodiment.

To facilitate understanding, FIG. 4 schematically illustrates an example of a plasma processing chamber system 400 that may be used in an embodiment. The plasma processing chamber system 400 includes a plasma reactor 402 having a plasma processing chamber 404 therein. A plasma power supply 406, tuned by a power matching network 408, supplies power to a transformer coupled plasma (TCP) coil 410 located near a dielectric inductive power window 412 to create a plasma 414 in the plasma processing chamber 404 by providing an inductively coupled power. A pinnacle 472 extends from a chamber wall 476 of the plasma processing chamber 404 to the dielectric inductive power window 412, forming a pinnacle ring. The pinnacle 472 is angled with respect to the chamber wall 476 and the dielectric inductive power window 412. For example, the interior angle between the pinnacle 472 and the chamber wall 476 and the interior angle between the pinnacle 472 and the dielectric inductive power window 412 may each be greater than 90° and less than 180°. The pinnacle 472 provides an angled ring near the top of the plasma processing chamber 404, as shown. The TCP coil (upper power source) 410 may be configured to produce a uniform diffusion profile within the plasma processing chamber 404. For example, the TCP coil 410 may be configured to generate a toroidal power distribution in the plasma 414. The dielectric inductive power window 412 is provided to separate the TCP coil 410 from the plasma processing chamber 404 while allowing energy to pass from the TCP coil 410 to the plasma processing chamber 404. A wafer bias voltage power supply 416 tuned by a bias matching network 418 provides power to ESC assembly 300 to set the bias voltage when a process wafer 466 is placed on the ESC assembly 300. A controller 424 controls the plasma power supply 406 and the wafer bias voltage power supply 416.

The plasma power supply 406 and the wafer bias voltage power supply 416 may be configured to operate at specific radio frequencies such as, for example, 13.56 megahertz (MHz), 27 MHz, 1 MHz, 2 MHz, 60 MHz, 400 kilohertz (kHz), 2.54 gigahertz (GHz), or combinations thereof. Plasma power supply 406 and wafer bias voltage power supply 416 may be appropriately sized to supply a range of powers in order to achieve the desired process performance. For example, in one embodiment, the plasma power supply 406 may supply the power in a range of 50 to 5000 Watts, and the wafer bias voltage power supply 416 may supply a bias voltage in a range of 20 to 3000 volts (V). In addition, the TCP coil 410 and/or the ESC assembly 300 may be comprised of two or more sub-coils or sub-electrodes. The sub-coils or sub-electrodes may be powered by a single power supply or powered by multiple power supplies.

As shown in FIG. 4, the plasma processing chamber system 400 further includes a gas source/gas supply mechanism 430. The gas source 430 is in fluid connection with plasma processing chamber 404 through a gas inlet, such as a gas injector 440. The gas injector 440 has at least one borehole 441 to allow gas to pass through the gas injector 440 into the plasma processing chamber 404. The gas injector 440 may be located in any advantageous location in the plasma processing chamber 404 and may take any form for injecting gas. Preferably, however, the gas inlet may be configured to produce a "tunable" gas injection profile. The tunable gas injection profile allows independent adjustment of the respective flow of the gases to multiple zones in the plasma process chamber 404. More preferably, the gas injector is mounted to the dielectric inductive power window 412. The gas injector may be mounted on, mounted in, or form part of the power window. The process gases and by-products are removed from the plasma process chamber 404 via a pressure control valve 442 and a pump 444. The pressure control valve 442 and pump 444 also serve to maintain a particular pressure within the plasma processing chamber 404. The pressure control valve 442 can maintain a pressure of less than 1 Torr during processing. One or more edge rings may be placed around a top part of the ESC assembly 300. The gas source/gas supply mechanism 430 is controlled by the controller 424. A Kiyo®, Strata®, or Vector® by Lam Research Corp.® of Fremont, CA, may be used to practice an embodiment.

A process wafer 466 is placed in the plasma processing chamber 404, and in particular on or within the ESC assembly 300, as shown in FIG. 3. A plasma process is applied to the process wafer 466 (e.g., step 120 of FIG. 1). In this example, the plasma processing of the process wafer 466 is used to provide an etch of part of a stack on the process wafer 466, such as for etching a tungsten-containing layer in the stack. In this embodiment, the plasma process heats up to a temperature above 550° C. In addition, the plasma process deposits residue on the interior of the plasma processing chamber 404. After the plasma processing of the process wafer 466, the process wafer 466 is removed from the plasma processing chamber 404. The plasma processing chamber 404 is cleaned to remove deposited residue. In this embodiment, a reactive fluorine from a remote fluorine plasma is used to clean the interior of the plasma processing chamber 404. A pressure in the range of 1 milliTorr (mTorr) to 10 Torr is provided. The ESC assembly 300 has not sufficiently cooled and remains at a temperature above 500° C. After the cleaning is completed, a new process wafer 466 may be placed in the plasma processing chamber 404 to begin a new cycle. In another example, the plasma processing is used to provide an etch comprising a carbon layer, polysilicon layer, or oxide/nitride layer. In such example, wafer temperature is controlled in the range of 0° C. to 150° C. and the chamber is cleaned after wafer processing by in-situ oxygen ($O_2$) and nitrogen trifluoride ($NF_3$) plasma.

In various embodiments, the intermediate fluoropolymer/PFA coating 216/224 and features of component 200 may be implemented in various parts of a plasma processing chamber 404, such as confinement rings, edge rings, the electrostatic chuck, ground rings, chamber liners, door liners, the pinnacle, a showerhead, a dielectric power window, gas injectors, edge rings, ceramic transfer arms, or other components. For example, the intermediate fluoropolymer/PFA coating 216/224 may be formed on a top edge ring 324. While the component 200 and ESC assembly 300 are shown in the embodiment of FIG. 4 with reference to use in an inductively coupled plasma (ICP) reactor for the plasma processing chamber system 400, it is appreciated that other components and/or types of plasma processing chambers may be used. Examples of other types of plasma processing chambers in which the component 200 may be used are capacitively coupled plasma processing chambers (CCP's), bevel plasma processing chambers, and the like processing chambers. In another example, the plasma processing chamber may be a dielectric processing chamber or conductor processing chamber. An example of such a plasma processing chamber is the Exelan Flex® etch system manufactured by Lam Research Corporation® of Fremont, CA.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A semiconductor processing chamber, comprising:
   a plasma processing chamber;
   an electrostatic chuck within the plasma processing chamber; and
   a component forming a ring around the electrostatic chuck, the component comprising:
   an electrically conductive semiconductor or metal body,
   wherein the body has a CTE of less than $10.0 \times 10^{-6}$/K;
   an intermediate layer disposed over at least one surface of the body, the intermediate layer comprising a fluoropolymer; and
   a perfluoroalkoxy alkane (PFA) layer disposed over the intermediate layer to form the component.

2. The semiconductor processing chamber, as recited in claim 1, wherein the body is a semiconductor body comprising silicon or silicon carbide.

3. The semiconductor processing chamber, as recited in claim 2, wherein the semiconductor body comprises elemental silicon.

4. The semiconductor processing chamber, as recited in claim 1, wherein the body has a CTE of less than $5.0 \times 10^{-6}$/K.

5. The semiconductor processing chamber, as recited in claim 1, wherein the intermediate layer is polyethersulfone (PES) resin-based to aid in bonding to the at least one surface of the body.

6. The semiconductor processing chamber, as recited in claim 1, wherein the intermediate layer is water or solvent borne to allow for application of the intermediate layer to the at least one surface of the body via spray deposition.

7. The semiconductor processing chamber, as recited in claim 1, wherein the PFA layer is applied to the intermediate layer via spray deposition for bonding to the intermediate layer.

8. The semiconductor processing chamber, as recited in claim 1,
wherein the component is exposed to corrosive processes in the plasma processing chamber and the PFA layer is resistant to damage or erosion by the corrosive processes.

9. The semiconductor processing chamber, as recited in claim 1, wherein the intermediate layer is fluorinated ethylene propylene resin-based to aid in bonding to the at least one surface of the body.

10. The semiconductor processing chamber, as recited in claim 1 wherein the fluoropolymer is at least one of fluorinated ethylene propylene (FEP) and polyethersulfone (PES).

11. A method for forming a component for use in a semiconductor processing chamber, the method comprising:
providing an electrically conductive semiconductor or metal body;
wherein the body has a CTE of less than $10.0 \times 10^{-6}$/K;
forming an intermediate layer over at least one surface of the body, the intermediate layer comprising fluoropolymer;
forming a perfluoroalkoxy alkane (PFA) layer over the intermediate layer to form the component; and
installing the component in a semiconductor processing chamber;
wherein the component forms a ring around an electrostatic chuck within the semiconductor processing chamber, the electrostatic chuck supporting a wafer for processing.

12. The method, as recited in claim 11, wherein the body is a semiconductor body comprising silicon or silicon carbide.

13. The method, as recited in claim 12, wherein the semiconductor body comprises elemental silicon.

14. The method, as recited in claim 11, wherein the body has a CTE of less than $5.0 \times 10^{-6}$/K.

15. The method, as recited in claim 11, wherein the intermediate layer is resin-based to aid in bonding to the at least one surface of the body.

16. The method, as recited in claim 15, wherein the resin comprises polyethersulfone (PES).

17. The method, as recited in claim 11, wherein the intermediate layer is water or solvent borne, and wherein forming an intermediate layer comprises applying the intermediate layer to the at least one surface of the body via spray deposition.

18. The method, as recited in claim 11, wherein the PFA layer is applied to the intermediate layer via spray deposition for bonding to the intermediate layer.

19. The method, as recited in claim 11:
wherein the semiconductor processing chamber comprises a plasma processing chamber; and
wherein the component is exposed to corrosive processes in the plasma processing chamber and the PFA layer is resistant to damage or erosion by the corrosive processes.

20. The method, as recited in claim 11, wherein the intermediate layer comprises at least one of fluorinated ethylene propylene and polyethersulfone.

21. An edge ring for use in a plasma processing chamber, comprising:
an elemental silicon edge ring body;
a fluoropolymer coating on at least one surface of the elemental silicon edge ring body; and
a perfluoroalkoxy alkane (PFA) coating on the fluoropolymer coating.

* * * * *